(12) United States Patent
Lai et al.

(10) Patent No.: US 7,052,826 B2
(45) Date of Patent: May 30, 2006

(54) MONITORING METHOD, PROCESS AND SYSTEM FOR PHOTORESIST REGENERATION

(75) Inventors: Ching Chin Lai, Hsinchu (TW); Fang Cheng Chang, Chiayi (TW); Ming En Chen, Tainan (TW); Jung Hsiang Chu, Hsinchu (TW); Kuang Ling Hsaio, Taipei (TW); Yun Lin Jang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/918,483

(22) Filed: Aug. 16, 2004

(65) Prior Publication Data

US 2005/0244761 A1 Nov. 3, 2005

(30) Foreign Application Priority Data

Apr. 29, 2004 (TW) .............................. 93112001 A

(51) Int. Cl.
*G03C 1/492* (2006.01)

(52) U.S. Cl. ........................ 430/398; 210/634; 210/641

(58) Field of Classification Search .................... None
See application file for complete search history.

(56) References Cited

FOREIGN PATENT DOCUMENTS

JP 11-133619 * 5/1999

OTHER PUBLICATIONS

English translation of JP 11-133619, May 1999.*

* cited by examiner

*Primary Examiner*—Rosemary Ashton
(74) *Attorney, Agent, or Firm*—Bacon & Thomas, PLLC

(57) ABSTRACT

A monitoring method for photoresist regeneration, a process and a system for the same are provided. In the photoresist regeneration process of the invention, the solid content and viscosity of photoresist are adjusted by condensation under reduced pressure or dilution with photoresist thinner until the final solid content and viscosity reach the predetermined values thereof obtained through the quantification equation of the invention and then the waste photoresist is caused to pass through filters for removing pollution particles contained therein, such that the regenerated photoresist is acquired.

16 Claims, 3 Drawing Sheets

Extract excess solvent from the waste photoresist solution by condensation under reduced pressure or dilute the waste photoresist solution with photoresist thinner (mixture of PM and PMP).

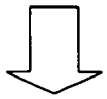

Monitor the solid content and viscosity of waste photoresist after condensation or dilution.

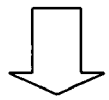

Discontinue the condensation or addition of solvent when the absorbance and viscosity of the condensed or diluted waste photoresist approximate the computed values.

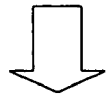

Pass the condensed or diluted waste photoresist through a filtering apparatus to remove particulates in it.

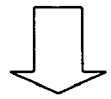

Regenerated photoresist

Fig. 1

MONITORING METHOD, PROCESS AND SYSTEM FOR PHOTORESIST REGENERATION

BACKGROUND OF THE INVENTION

1. Field of the Invention

The present invention provides a monitoring method, a process and a system for recovering and reutilizing waste photoresist.

2. Description of the Related Art

Photoresist is an important chemical in the semiconductor process. After being exposed to light of proper wavelength, the exposed part of the photoresist material would undergo chemical reaction to become hardened by cross-linking or result in a compound that readily reacts with developer. Subsequently through the development process, the exposed pattern is developed.

In the semiconductor process, photoresist is commonly deposited on the glass substrate by spin coating. In order to obtain a uniform coat, photoresist is typically dispensed in excess amount. Generally, approximately one tenth of the dispensed photoresist is deposited on the glass substrate, while the rest are spun onto the interior walls or discharged into the collection tank. In the process of coating, the machine would rinse the interior walls periodically with solvent to wash off the photoresist thereon, and the solvent and the photoresist are flushed into the collection tank. The photoresist in the collection tank could have been diluted by the large amount of cleaning solvent, or become concentrated as a result of air suction, given the different coating process used.

In recent years, the development efforts have been focused on positive and negative photoresist as well as photoresist thickness. Newly developed thick photoresist is costly, thus increasing the production cost. The disposal of waste photoresist generated in the process also poses a problem. If the waste photoresist can be recycled and reutilized, it would help lower cost and reduce possible contamination.

The TW Pat. No. 389,850 discloses "a device for recovering photoresist discharged from spin coater", using a driver motor in the spin coater set at alternating speed to collect the mixture of excess photoresist and cleaning solvent at predetermined interval. This patented technology only provides a method for recovering waste photoresist solution, but does not disclose the reutilization of the recycled waste photoresist. JP Patent 2002-23388 discloses an organic solvent recovering device and pattern forming method using this device, which provides a method of separating solvent and photoresist under reduced pressure. This method may recycle both the photoresist and the solvent, but does not provide in detail the monitoring of the separation procedure and quality control of the recycled photoresist. Another JP Patent No.11-133619 discloses a method for recycling photoresist, which collects waste solution containing waste photoresist and EBR and measures its solid content; if the solid content is too high, solvent is added to adjust the concentration; conversely excess solvent is evaporated. Subsequently the photoresist is filtered to remove particulate matters and pollutants. This patent only provides a concept of photoresist recovery, but does not propose the specific control conditions for adjusting and recovering the photoresist.

The present invention discloses a specific method for monitoring the regeneration of photoresist, which can monitor the quality of the recycled photoresist, and in combination with the photoresist regeneration process, recover waste photoresist and reuse it in all kinds of processes. The present invention not only helps lower production cost, but also minimize the pollution problem presented by the disposal of large amount of waste fluid.

SUMMARY OF THE INVENTION

According to the different coating processes, waste photoresist might be diluted by the cleaning solvent used in the process or become concentrated as a result of air suction. The present invention provides a process and a system for regenerating waste photoresist in either condition just described. The present invention also provides a monitoring method for photoresist regeneration to make sure the regenerated photoresist meets the film thickness requirement of different processes.

A monitoring method for photoresist regeneration is provided, comprising the steps of:

(a) diluting the waste photoresist with photoresist thinner into different viscosities ($\mu_0$);

(b) measuring the solid content ($C_0$) of said photoresists having different viscosities ($\mu_0$) and their film thickness($H_f$) under fixed spin speed;

(c) using steps (a) and (b) to establish the relationship of viscosity, solid content and film thickness of waste photoresist, and thereby, to obtain the values of constants $k_0$, $\alpha$, and $\beta$ in Equation (I) $H_f = k_0 C_0^\alpha \mu_0^\beta$;

(d) substituting the target thickness desired in actual operation into Equation (I) $H_f = k_0 C_0^\alpha \mu_0^{62}$ with known constants $k_0$, $\alpha$, and $\beta$ obtained in step (c) to calculate the target solid content and viscosity of the regenerated photoresist; and (e) monitoring the solid content and viscosity of the photoresist to be regenerated to observe their proximity to the target values obtained in step (d) so as to determine whether said photoresist could be recycled as regenerated photoresist.

In this invention, the term "waste photoresist" refers to discarded photoresist that has been used but has not been treated in photoresist regeneration process. Waste photoresist could have been diluted by the mixture of cleaning solvent or condensed as a result of air suction that changes its solid content and viscosity. The term "regenerated photoresist" refers to waste photoresist that has been through the treatment steps of solid content adjustment, viscosity adjustment and removal of impurities. After the aforesaid treatment steps, regenerated photoresist meets the use specifications for solid content and viscosity, and may be reutilized in processes. The term "target thickness" refers to the expected film thickness of regenerated photoresist produced under fixed spin speed.

A process for photoresist regeneration is provided, comprising the steps of:

(a) extracting excess solvent from the waste photoresist solution by condensation under reduced pressure or diluting the waste photoresist solution with photoresist thinner to adjust its solid content($C_0$) and viscosity($\mu_0$);

(b) monitoring the solid content ($C_0$) and viscosity ($\mu_0$) of the waste photoresist after condensation or the addition of thinner;

(c) discontinuing the condensation or dilution procedure when the solid content and viscosity of the condensed or diluted waste photoresist reach predetermined values that determined by the abovementioned monitoring method to obtain target thickness ($H_f$) under fixed spin speed; and (d) passing the condensed or diluted waste photoresist through a filtering apparatus to remove particulates therein and to obtain regenerated photoresist that can be reutilized.

A photoresist regeneration system is provided, comprising:

a waste photoresist regulating apparatus, comprising a rotary evaporator, solvent dispensing device, a low-temperature water bath, and a water-powered suction pump;

a monitoring apparatus, comprising a spectrophotometer and a viscometer; and a filtering apparatus, comprising at least a filter having pore size ranging from 1.0~0.1 μm.

A regenerated photoresist is provided, which is obtained from the photoresist regeneration process according to this invention and can be used in semiconductor process.

The present invention removes cleaning solvent from the waste photoresist solution by condensation under reduced pressure or adjusts the solvent ratio in it by the addition of solvent, and establishes a quantification equation by the relationship among viscosity, solid content and film thickness to determine the solid content and viscosity of the regenerated photoresist and achieve the target thickness. After the tests of coating, development and etching, the performance of regenerated photoresist obtained according to the present invention is shown to approximate the specifications of fresh photoresist, indicating that the method disclosed in the invention can regenerate photoresist and effectively monitor the quality of the regenerated photoresist to achieve the objectives of cost reduction and resources recovery.

BRIEF DESCRIPTION OF THE DRAWINGS

FIG. 1 shows the flow chart for photoresist regeneration according to the invention.

DETAILED DESCRIPTION OF THE INVENTION

Figure 2:
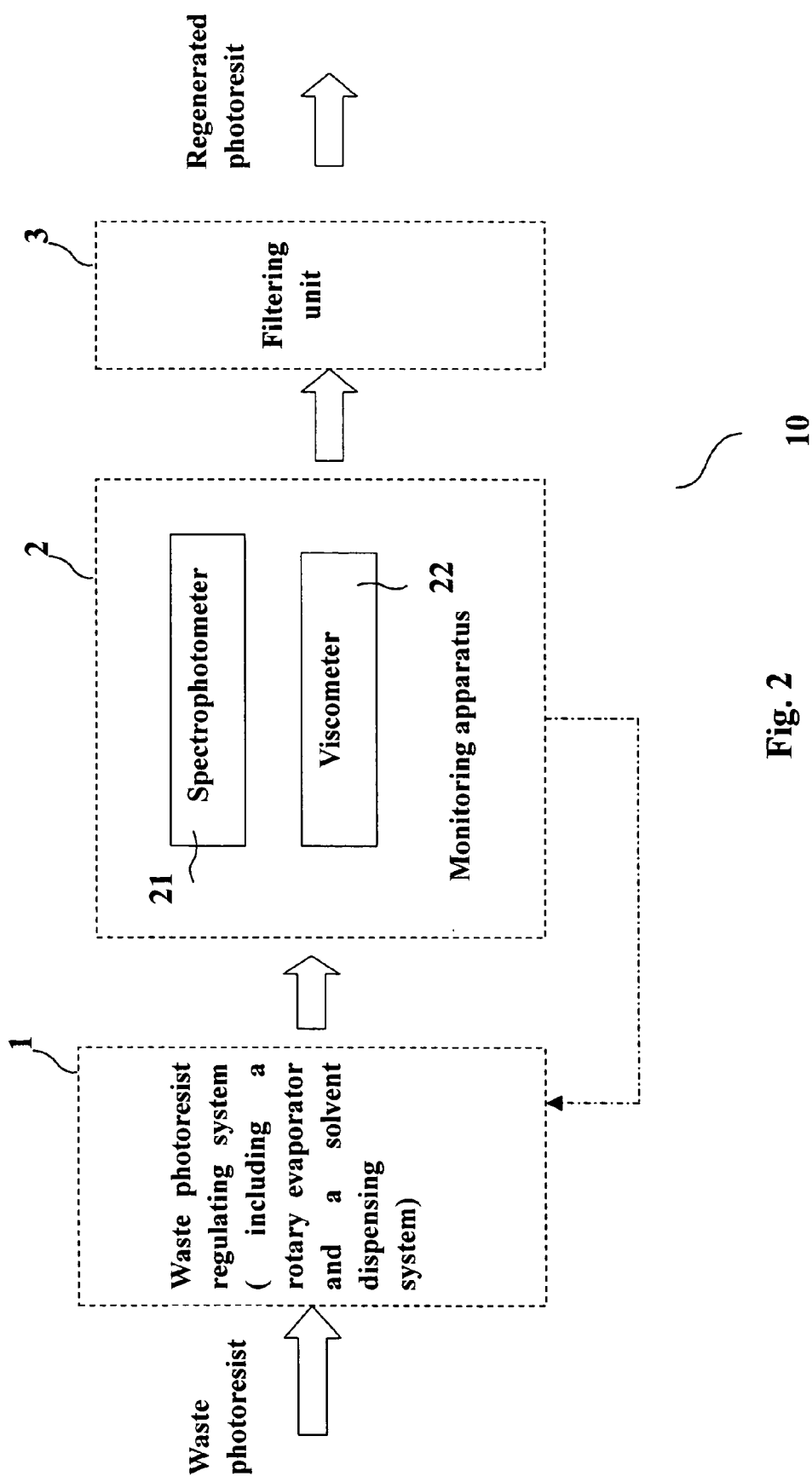
FIG. 2 shows a schematic diagram of the photoresist regeneration system according to the invention.

There are dry film and wet film in the photoresist coating process. The thickness of wet film is dependent on the kinetic viscosity of photoresist ($\mu/\rho$; $\mu$ is viscosity of photoresist, $\rho$ is density of photoresist). The proportion of solvent also affects the thickness of wet film. In the baking of substrate after photoresist coating, the solid content of the photoresist also affects its film thickness; high solid content will produce thicker film and lower solid content will result in thinner film. Based on the descriptions above and under a number of assumptions, the relationship between dry film thickness and wet film thickness may be expressed as follows: (Meyerhofer, D., "Characteristics of resist films produced by spinning", J. Appl. Phys., 49(7), p3993–3997, 1978):

$$H_f = \left(\frac{3}{2}\right)^{1/3} k^{1/3} C_o (1-C_o)^{1/3} \rho^{-1/3} \mu_o^{1/3} \Omega^{-1/2} \quad (II)$$

$H_f$: dry film thickness (a constant)
k: constant, solvent related
$C_o$: initial solid content
$\rho$: density
$\mu_o$: initial viscosity of solution
$\Omega$: spin speed Experimental results show that Equation (II) is unable to identify the exact relationship of dry film thickness, solid content and viscosity. Also, photoresist density and the spin speed for dispensing photoresist are commonly fixed. Under the premises that photoresist density and spin speed are fixed values, the spin speed and density factors in Equation (II) are combined into constant, and a simplified Equation (I) which depicts the relationship of film thickness, solid content and viscosity is proposed as the quantification equation for quality control of regenerated photoresist.

$$H_f = k_0 C_0^\alpha \mu_0^\beta \quad (I)$$

$k_0, \alpha, \beta$: constant
$C_0$: solid content of solution
$\mu_0$: viscosity of solution Wherein the values of $k_0$, $\alpha$, and $\beta$ can be obtained from experiments as illustrated later in the examples below. Given that solid content can be expressed by absorbance, the present invention controls the quality of regenerated photoresist by monitoring its absorbance and viscosity.

The present invention provides a monitoring method for photoresist regeneration using Equation (I) that depicts the relationship of film thickness, solid content and viscosity. Said method identifies the relationship between the film thickness of waste photoresist under constant spin speed and different viscosity and solid content, from which the values of constants $k_0$, $\alpha$, and $\beta$ in Equation (I) are obtained, and thereby determines the desired viscosity and solid content of regenerated photoresist from the equation.

The aforesaid monitoring method comprises the steps of: first diluting the waste photoresist with photoresist thinner into different viscosities ($\mu_0$); next determining the solid content of waste photoresist solution ($C_0$) under different viscosities ($\mu_0$) and film thickness ($H_f$) under fixed spin speed; using the relationship of viscosity, solid content and film thickness of waste photoresist measured above to find the values of constant $k_0$, $\alpha$, and $\beta$ in Equation (I) $H_f = k_0 C_0^\alpha \mu_0^\beta$; subsequently substituting the target thickness desired in actual operation into Equation (I) to calculate the desired solid content and viscosity, which are the control standards for the regenerated photoresist; when the solid content and viscosity of the condensed or diluted waste photoresist approximate the computed values, said waste photoresist can be recycled.

Referring to FIG. 1 and FIG. 2, the application of the aforesaid monitoring method in the photoresist regeneration process and the photoresist regeneration system are illustrated in detail. FIG. 1 is the flow chart for the photoresist regeneration process according to the present invention. FIG. 2 is a schematic diagram of the photoresist regeneration system 10. The photoresist regeneration process is carried out in the photoresist regeneration system 10, which includes a waste photoresist regulating apparatus 1, a monitoring apparatus 2, and a filtering apparatus 3, wherein said waste photoresist regulating apparatus 1 comprises rotary evaporator, solvent dispensing device, low-temperature water bath, and water-powered suction pump; said monitoring apparatus 2 includes a spectrophotometer and a viscometer; said filtering apparatus 3 includes at least a filter having pore size ranging from 1.0~0.1 μm.

In the photoresist regeneration process of the present invention, waste photoresist from semiconductor process is placed in the waste photoresist regulating apparatus 1, where system temperature is controlled between 0~40° C., preferably 30° C., and the solid content and viscosity of the recycled photoresist solution is monitored using spectrophotometer 21 and viscometer 22 in the monitoring apparatus 2;

if the waste photoresist is diluted by the cleaning solvent used in the process to the point that its solid content becomes too low, excess solvent is removed using the rotary evaporator in the waste photoresist regulating apparatus 1 under absolute pressure below 3 cm Hg; if the waste photoresist is condensed due to air suction in the process to the point that its solid content becomes too high, photoresist thinner is added through the solvent dispensing device in waste photoresist regulating apparatus 1 to lower the sold content of the waste photoresist. The photoresist thinner used in the present invention is preferably the mixture solvent of propylene glycol monomethyl ether(PM) and propylene glycol monomethyl ether propionate(PMP). In the process of condensation under reduced pressure or dilution with photoresist thinner, the absorbance and viscosity of the waste photoresist solution are monitored by spectrophotometer 21 and viscometer 22 in the monitoring apparatus 2 until the final absorbance and viscosity reach the values obtained through Equation (I); the absorbance is measured over the range of 400~700 nm, preferably at 590 nm; finally the waste photoresist with solid content adjusted is passed through a filtering apparatus 3 to have particulate matters in the solution removed; said filtering apparatus 3 preferably comprises 1.0 μm, 0.21 μm, and 0.1 μm filter membranes arranged in tandem; the waste photoresist with solid content adjusted and having passed through the filtering apparatus 3 is regenerated photoresist that can be reutilized.

The regenerated photoresist of the present invention can be used in pattern formation in semiconductor process, comprising the steps of coating the regenerated photoresist on a substrate; baking the substrate; exposing the substrate to high energy beam or electronic beam with the use of photomask; and using special solvent to develop the pattern.

The present invention is further depicted in the illustration of examples, but the descriptions made in the examples should not be construed as a limitation on the actual application of the present invention.

EXAMPLES

Experimental Apparatus

As shown in FIG. 2, the experimental apparatus in this example includes: waste photoresist regulating apparatus which comprises a rotary evaporator, a solvent dispensing device, a low-temperature water bath, and a water-powered suction pump; the monitoring apparatus, which comprises a spectrophotometer and a viscometer; and filtering apparatus consisting of 1.0 μm, 0.2 μm, and 0.1 μm filter membranes arranged in tandem.

Absorbance—Solid Content Calibration Curve

Figure 3:
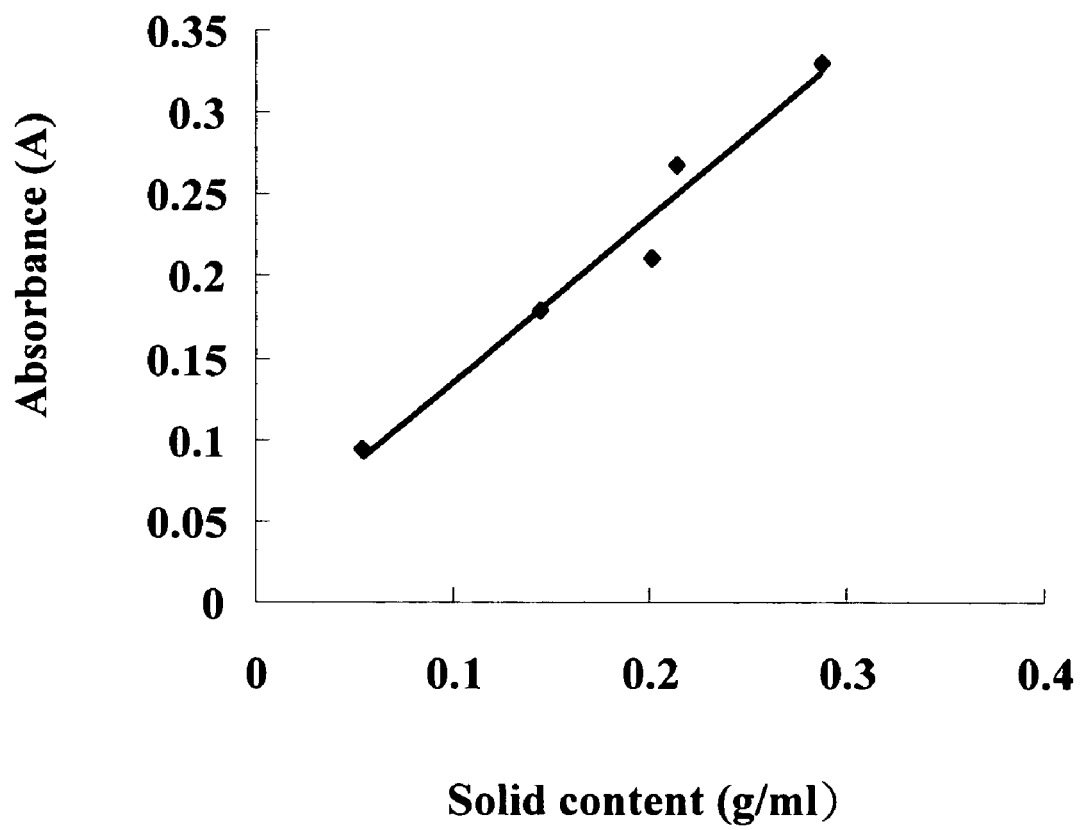
FIG. 3 is the calibration curve of solid content vs. absorbance.

Pipette respectively 4, 8, 12, and 16 mL of photoresist into beakers, then add photoresist thinner (the mixture of propylene glycol monomethyl ether (PM) and propylene glycol monomethyl ether propionate(PMP)) up to 20 mL. Measure the absorbance of the four diluted photoresist and undiluted photoresist at 590 nm in 1 mm light path cuvette. For determination of solid content, pipette 5 mL of photoresist in a glass container with known weight; bake the glass container in 80° C. oven until the photoresist is dried; weigh the glass container after it reaches room temperature. The relationship between absorbance and solid content is as shown in FIG. 3, from which a mathematical formula is derived:

Absorbance=1.0105×solid content+0.0344    (III)

$R^2$=0.9671

This result shows that solid content and absorbance are in direct proportion to each other. The absorbance-solid content calibration curve obtained is used to determine the desired solid content by monitoring absorbance.

Measuring the Physical Properties of Waste Photoresist

Given the different coating process used, waste photoresist might be diluted by the large amount of solvent used or become condensed as a result of air suction. In this example, the physical properties of fresh photoresist and those of diluted and condensed waste photoresist from the semiconductor process are compared as reference for the photoresist regeneration process.

In this example, the viscosity, absorbance and density of fresh photoresist as well as diluted waste photoresist and condensed waste photoresist from the process were measured using methods familiar to those in the field, and their solid content is derived from Equation (III) herein. The results are as shown in Table 1. The absorbance is measured at the wavelength of 590 nm.

TABLE 1

|  | Viscosity (cps) | Solid content (g/mL) | Absorbance (Abs) | Density (g/mL) |
| --- | --- | --- | --- | --- |
| Fresh photoresist | 15.03 | 0.31 | 0.34 | 1.00 |
| Diluted waste photoresist | 6.30 | 0.15 | 0.17 | 0.82 |
| Condensed waste photoresist | 18.53 | 0.43 | 0.59 | 1.01 |

As shown, the density, solid content and viscosity of diluted waste photoresist are smaller than those of fresh photoresist, while those of condensed waste photoresist are larger than fresh photoresist.

Quantification Equation

Dilute waste photoresist with photoresist thinner (mixture of PM and PMP) into regenerated photoresist with different viscosities. Measure their absorbance at 590 nm, and compute solid content from Equation (III) above. Next coat the regenerated photoresists having different viscosities onto a substrate under the constant spin speed of 1500 rpm, and measure the spin coated film thickness of photoresist with Nanospac. The results are as shown in Table 2.

TABLE 2

| Film thickness $H_f$ (Å) | Solid content $C_0$ (g/mL) | Viscosity $\mu_0$ (cps) |
| --- | --- | --- |
| 9307.60 | 0.31 | 11.97 |
| 10306.00 | 0.34 | 13.02 |
| 11229.44 | 0.35 | 13.99 |
| 12418.12 | 0.36 | 15.02 |
| 12839.36 | 0.37 | 16.08 |
| 13468.56 | 0.38 | 17.06 |
| 14062.00 | 0.39 | 18.09 |

By applying regression analysis to the experimental data in Table 2, the following equation is derived:

$ln(H_f) = \alpha \times ln(C_0) + \beta \times ln(\mu_0) + 7.926$    (IV)

α=0.520
β=0.737
$r^2$=0.948

Under constant spin speed (1,500 rpm in this example), the solid content and viscosity of photoresist corresponding to the target thickness can be obtained from the equation above. For example, when the target thickness of photoresist is 10750 Å, its solid content and viscosity must conform to Equation (V) below:

$$K = \alpha \times \ln(C_0) + \beta \times \ln(\mu_0) = 1.36 \tag{V}$$

Photoresist Regeneration Process

In this example, waste photoresist is treated in one of the two ways: when the waste photoresist is in diluted state, the waste solution is placed in a rotary evaporator to undergo condensation under reduced pressure to remove excess cleaning solvent; the operating pressure is maintained under 3 cm-Hg, and the temperature is controlled under 30° C.; when the waste photoresist is in condensed state, the waste photoresist is diluted with the mixture of PM and PMP to adjust its viscosity and solid content. In the process of condensation or dilution, the waste photoresist is monitored by spectrophotometer at the wavelength of 590 nm and its viscosity measured. The condensation time or amount of dilution solvent added is determined using Equation V. When the absorbance and the viscosity of waste photoresist conform to Equation V, the condensation or the dilution process is stopped. The adjusted waste photoresist is then passed through 1.0 μcm, 0.2 μm, and 0.1 μm filter membranes in sequence to remove particulate matters in it so as to meet the requirement of the semiconductor process. Such adjusted and filtered waste photoresist can be reutilized as regenerated photoresist, which may produce a film thickness of 10750 Å under fixed spin speed.

Determining the Quality of Regenerated Photoresist

In this example, the regenerated photoresist is tested in the following manner: dispense the regenerated photoresist on chromium-plated glass substrate using Kaijo spin coater under 5 sec acceleration time and spin speed of 1500 rpm for 17 seconds. Afterwards, soft bake the glass substrate under 100° C. for 18 seconds. Use Nanspac to measure the film thickness and uniformity. The results are as shown in Table 3.

Next undergo exposure and development to test the applicability of regenerated photoresist in semiconductor process by the following steps: expose the soft-baked, photoresist-coated substrate for 90 seconds using stepper Nikon FX602K, then develop with 2.38% tetramethylammonium hydroxide (TMAH), and examine the results as shown in Table 3.

TABLE 3

| No. | Operating conditions | Film thickness Accept criteria: 10000 ± 1400 Å | Uniformity Accept criteria: 2% | Exposure and development |
|---|---|---|---|---|
| 1 | Undergo condensation under reduced pressure and water temp of 30° C. | 11301 Å | 1.27% | Pass |
| 2 | Undergo condensation under reduced pressure and water temp of 30° C. (reproducibility test) | 9659 Å | 1.55% | Pass |
| 3 | Add mixture of PM and PMP to condensed waste photoresist | 10887 Å | 0.94% | Pass |
| 4 | Add mixture of PM and PMP to condensed waste photoresist (reproducibility test) | 11243 Å | 0.76% | Pass |

The results show that the film thickness and uniformity of the regenerated photoresist recycled using the photoresist regeneration process according to the present invention conform to the requirements of the semiconductor process, and its further exposure and development also meet the process requirements.

The preferred embodiments of the present invention have been disclosed in the examples. However the examples should not be construed as a limitation on the actual applicable scope of the invention, and as such, all modifications and alterations without departing from the spirits of the invention and appended claims, including the other embodiments shall remain within the protected scope and claims of the invention.

What is claimed is:

1. A monitoring method for photoresist regeneration, comprising the steps of:
    (a) diluting the waste photoresist with photoresist thinner into different viscosities ($\mu_0$);
    (b) measuring the solid content ($C_0$) of said photoresists having different viscosities ($\mu_0$) and their coated thickness($H_f$) under fixed spin speed;
    (c) using steps (a) and (b) to establish the relationship of viscosity, solid content and film thickness of waste photoresist, and thereby, to obtain the values of constants $k_0$, $\alpha$, and $\mu$ in Equation (I) $H_f = k_0 C_0^\alpha \mu_0^\beta$;
    (d) substituting the target thickness desired in actual operation into Equation (I) $H_f = k_0 C_0^\alpha \beta_0^\beta$ with known constants $k_0$, $\alpha$, and $\beta$ obtained in step (c) to calculate the target solid content and viscosity of the regenerated photoresist; and
    (e) monitoring the solid content and viscosity of the photoresist to be regenerated to observe their proximity to the target values obtained in step (d) so as to determine whether said photoresist could be recycled as regenerated photoresist.

2. The method according to claim 1, wherein the photoresist thinner in step (a) is a mixture of propylene glycol monomethyl ether (PM) and propylene glycol monomethyl ether propionate(PMP).

3. The method according to claim 1, wherein the solid content of photoresist in step (b) is obtained from the measurement of absorbance.

4. A process for photoresist regeneration, comprising the steps of:
    (a) extracting excess solvent from the waste photoresist solution by condensation under reduced pressure or diluting the waste photoresist solution with photoresist thinner to adjust its solid content and viscosity;
    (b) monitoring the solid content ($C_0$) and viscosity ($\mu_0$) of the waste photoresist after condensation or the addition of thinner;
    (c) discontinuing the condensation or dilution procedure when the solid content and viscosity of the condensed or diluted waste photoresist reach predetermined values to obtain target thickness ($H_f$) under fixed spin speed as determined by the monitoring method in claim 1; and (d) passing the condensed or diluted waste photoresist through a filtering apparatus to remove particulates therein and to obtain regenerated photoresist that can be reutilized.

5. The process according to claim 4, wherein when the solid content of waste photoresist is lower than that of fresh photoresist, condensation under reduced pressure in step (a) is carried out.

6. The process according to claim 4, wherein when the solid content of waste photoresist is higher than that of fresh photoresist, dilution with photoresist thinner in step (a) is carried out.

7. The process according to claim 4, wherein in the condensation process in step (a), the absolute pressure is less than 3 cm Hg and the operating temperature is between 0~40.

8. The process according to claim 7, wherein in the condensation process in step (a), the absolute pressure is less than 3 cm Hg and the operating temperature is 30.

9. The process according to claim 4, wherein the photoresist thinner in step (a) is a mixture of propylene glycol monomethyl ether (PM) and propylene glycol monomethyl ether propionate(PMP).

10. The process according to claim 4, wherein the solid content of photoresist in step (b) is obtained from the measurement of absorbance.

11. The process according to claim 10, wherein the absorbance in step (b) is measured over the wavelength range of 400~700 nm.

12. The process according to claim 11, wherein the absorbance is measured at 590 nm.

13. The process according to claim 4, wherein the filtering apparatus in step (d) comprises at least one filter membrane having pore size ranging from 0.1~1.0 μm.

14. The process according to claim 13, wherein the filtering apparatus in step (d) comprises 1.0 μm, 0.2 μm, and 0.1 μm filter membranes arranged in tandem in such sequence.

15. The process according to claim 4, wherein said waste photoresist solution comprises waste photoresist solution from optoelectric or semiconductor process.

16. A photoresist regeneration system, comprising:

a waste photoresist regulating apparatus, comprising a rotary evaporator, a solvent dispensing device, a low-temperature water bath, and a water-powered suction pump;

a monitoring apparatus, comprising a spectrophotometer and a viscometer; and a filtering apparatus, comprising filter membranes having respective pore sizes of 1.0 μm, 0.2 μm, and 0.1 μm arranged in tandem in such sequence.

* * * * *